United States Patent
Tsao et al.

(10) Patent No.: US 10,333,271 B2
(45) Date of Patent: Jun. 25, 2019

(54) PIN-COVERING APPARATUS AND BI-DIRECTIONAL OPTICAL DEVICE USING THE SAME

(71) Applicant: PEGATRON CORPORATION, Taipei (TW)

(72) Inventors: Wei-Chun Tsao, Taipei (TW); Ping-Chung Lo, Taipei (TW); Shin-Min Lee, Taipei (TW); Chang-Wei Wu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 44 days.

(21) Appl. No.: 15/668,112

(22) Filed: Aug. 3, 2017

(65) Prior Publication Data

US 2018/0123315 A1    May 3, 2018

(30) Foreign Application Priority Data

Nov. 2, 2016   (TW) .............................. 105135584 A

(51) Int. Cl.
| | |
|---|---|
| *H01S 5/026* | (2006.01) |
| *H01S 5/10* | (2006.01) |
| *G02B 6/28* | (2006.01) |
| *G02B 6/42* | (2006.01) |
| *H05K 5/02* | (2006.01) |
| *G02B 6/00* | (2006.01) |

(52) U.S. Cl.
CPC .............. *H01S 5/0262* (2013.01); *G02B 6/28* (2013.01); *G02B 6/4202* (2013.01); *G02B 6/4277* (2013.01); *H01S 5/10* (2013.01); *H05K 5/0208* (2013.01); *G02B 6/426* (2013.01); *G02B 6/4246* (2013.01)

(58) Field of Classification Search
CPC .............. G02B 6/00; H01S 5/026; H01S 5/10
USPC ......................................................... 385/14
See application file for complete search history.

(56) References Cited

U.S. PATENT DOCUMENTS

| | | | | |
|---|---|---|---|---|
| 3,864,531 A | * | 2/1975 | Watson ................. | H04R 19/04 381/111 |
| 4,940,050 A | * | 7/1990 | Forssmann ............ | G10K 15/06 340/686.2 |
| 5,008,770 A | * | 4/1991 | Hilland .............. | H01R 13/6666 361/111 |
| 5,173,159 A | * | 12/1992 | Dutertre ................ | B01D 57/02 204/457 |

(Continued)

FOREIGN PATENT DOCUMENTS

| | | |
|---|---|---|
| CN | 204964822 U | 1/2016 |
| JP | 2005217074 A | 8/2005 |

(Continued)

*Primary Examiner* — Kaveh C Kianni
(74) *Attorney, Agent, or Firm* — Muncy, Geissler, Olds & Lowe, P.C.

(57) ABSTRACT

A pin-covering apparatus applied to a plurality of pins of an emitting end of a bi-directional optical module comprises a plurality of mediums and a plurality of metal sleeves. The mediums respectively cover the pins. The metal sleeves cover the mediums by taking the pins as centers, respectively. The metal sleeves are disposed at the emitting end of the bi-directional optical module. A bi-directional optical device using the pin-covering apparatus is also disclosed.

12 Claims, 2 Drawing Sheets

(56) References Cited

U.S. PATENT DOCUMENTS

| | | | | |
|---|---|---|---|---|
| 5,554,110 A * | 9/1996 | Edwards | | A61B 10/0233 604/22 |
| 6,206,582 B1 * | 3/2001 | Gilliland | | G02B 6/4277 385/139 |
| 6,257,741 B1 * | 7/2001 | Williams | | A61B 1/0669 362/296.01 |
| 6,316,954 B1 * | 11/2001 | Venaleck | | G01R 31/2887 324/754.14 |
| 6,520,787 B1 * | 2/2003 | Lott | | H01R 27/00 439/166 |
| 8,907,272 B1 * | 12/2014 | Wouters | | H01J 49/066 250/281 |
| 2003/0014864 A1 * | 1/2003 | Gazelot | | H05K 3/306 29/852 |
| 2004/0013150 A1 * | 1/2004 | Tulip | | H01S 3/0315 372/55 |
| 2004/0021419 A1 * | 2/2004 | Ito | | H01J 61/10 313/637 |
| 2004/0041523 A1 * | 3/2004 | Kawai | | H01J 61/68 313/634 |
| 2004/0046506 A1 * | 3/2004 | Kawai | | H01J 61/54 313/634 |
| 2004/0182707 A1 * | 9/2004 | Jardemark | | B82Y 15/00 204/451 |
| 2011/0041696 A1 * | 2/2011 | Aemisegger | | A47J 31/3623 99/281 |
| 2011/0183529 A1 * | 7/2011 | Heise | | H01R 13/33 439/1 |
| 2013/0051413 A1 * | 2/2013 | Chen | | H01S 5/02 372/36 |
| 2013/0067736 A1 * | 3/2013 | Peng | | H05K 1/182 29/741 |
| 2013/0241443 A1 * | 9/2013 | Ozguc | | F21V 25/04 315/362 |
| 2013/0300452 A1 * | 11/2013 | Liu | | G01R 31/2635 324/762.07 |
| 2014/0138721 A1 * | 5/2014 | Liao | | H01L 33/644 257/89 |
| 2016/0030652 A1 * | 2/2016 | Arndt | | A61M 1/10 600/16 |
| 2017/0174520 A1 * | 6/2017 | Walters | | B01J 19/08 |
| 2017/0179477 A1 * | 6/2017 | Walters | | C23C 16/4417 |
| 2018/0230794 A1 * | 8/2018 | Donderici | | E21B 47/02216 |

FOREIGN PATENT DOCUMENTS

| | | |
|---|---|---|
| TW | 201315308 A | 4/2013 |
| WO | WO0055665 A2 | 9/2000 |

* cited by examiner

PIN-COVERING APPARATUS AND BI-DIRECTIONAL OPTICAL DEVICE USING THE SAME

CROSS REFERENCE TO RELATED APPLICATIONS

This Non-provisional application claims priority under 35 U.S.C. § 119(a) on Patent Application No(s). 105135584 filed in Taiwan, Republic of China on Nov. 2, 2016, the entire contents of which are hereby incorporated by reference.

BACKGROUND OF THE INVENTION

Technology Field

This invention relates to a pin-covering apparatus and, in particular, to a pin-covering apparatus using metal sleeves to cover mediums and disposed at the bi-directional optical module.

Description of Related Art

Generally, the pins of the bi-directional optical module are welded to the connection points of the circuit board to achieve the installation and electrical connection between the bi-directional optical module and the circuit board. Because the pins are not arranged coplanarly, relative to the surface of the circuit board, on the end surface of the emitting end or the receiving end, the distance from each of the pins to the surface of the circuit board may be different. Thus, when being installed or welded, the pins need to be bent so that the pins can align and contact with the connection points disposed on the surface of the circuit board. Besides, the metal material of the pin will be easily bent and thus deformed, and this will increase the operational trouble and positioning difficulty during the processes of pin arrangement, installation and welding.

Moreover, since the pins of the conventional bi-directional optical module are exposed, they will function like antennas to cause the scattering of signal under the high-speed optical communication operation. Therefore, the transmission efficiency will be reduced and the external disturbance will be easily introduced.

Therefore, a pin-covering apparatus disposed at the bi-directional optical module and using metal sleeves to cover mediums is provided by this invention, so as to improve the above-mentioned deficiencies, and the pin-covering apparatus will be described and illustrated as below.

SUMMARY

A pin-covering apparatus and a bi-directional optical device using the same are provided by this invention, so as to solve the deficiencies where the pins of the conventional bi-directional optical module are easily bent and deformed, the positioning is difficult and the signals of the pins will be scattered and the external disturbance will be easily introduced.

To achieve the above objective, one embodiment disclosed by this invention relates to a pin-covering apparatus, which is applied to a plurality of pins of an emitting end of a bi-directional optical module. The pin-covering apparatus comprises a plurality of mediums and a plurality of metal sleeves. The mediums respectively cover the pins. The metal sleeves cover the mediums by taking the pins as centers, respectively. This is the same as the principle of coaxial cable. The metal sleeves are disposed at the emitting end of the bi-directional optical module.

In one embodiment, the pin-covering apparatus further comprises a metal plate. The metal sleeves of the pin-covering apparatus are disposed on the metal plate first and then the metal plate with the metal sleeves is disposed at the emitting end of the bi-directional optical module.

In one embodiment, the metal plate of the pin-covering apparatus has a plurality of holes, and the number and the diameter of the holes correspond to the number of the pins and the diameter of the metal sleeves, respectively.

In one embodiment, the material of the medium is selected from the group of polyethylene or polytetrafluoroethylene.

In one embodiment, the metal sleeves are capable of being bent for about 90 degrees so that the pins can pass through a circuit board which has a plurality of holes and is disposed under and parallel with the bi-directional optical module.

Another embodiment of this invention relates to a bi-directional optical device, which comprises a bi-directional optical module and a pin-covering apparatus. The bi-directional optical module includes an emitting end including a plurality of pins. The pin-covering apparatus is used to cover the pins and comprises a plurality of mediums and a plurality of metal sleeves. The mediums respectively cover the pins. The metal sleeves cover the mediums by taking the pins as centers, respectively. This is the same as the principle of coaxial cable. The metal sleeves are disposed at the emitting end of the bi-directional optical module.

In one embodiment, the pin-covering apparatus further comprises a metal plate. The metal sleeves of the pin-covering apparatus are disposed on the metal plate first and then the metal plate with the metal sleeves is disposed at the emitting end of the bi-directional optical module.

In one embodiment, the metal plate of the pin-covering apparatus has a plurality of holes, and the number and the diameter of the holes correspond to the number of the pins and the diameter of the metal sleeves, respectively.

In one embodiment, the material of the medium is selected from the group of polyethylene or polytetrafluoroethylene.

In one embodiment, the metal sleeves are capable of being bent for about 90 degrees so that the pins can pass through a circuit board which has a plurality of holes and is disposed under and parallel with the bi-directional optical module.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

This invention will be illustrated as below and with reference to the figures, but the figures are only for the illustrative purpose but not for limiting the scope of this invention.

The terms used herein such as "comprising", "including", "having", or "containing" are intended to be used in an unlimited (open-ended) sense and mean "comprising but not limited to".

The term "and/or" used herein indicates any or all combinations of said elements.

Figure 1:
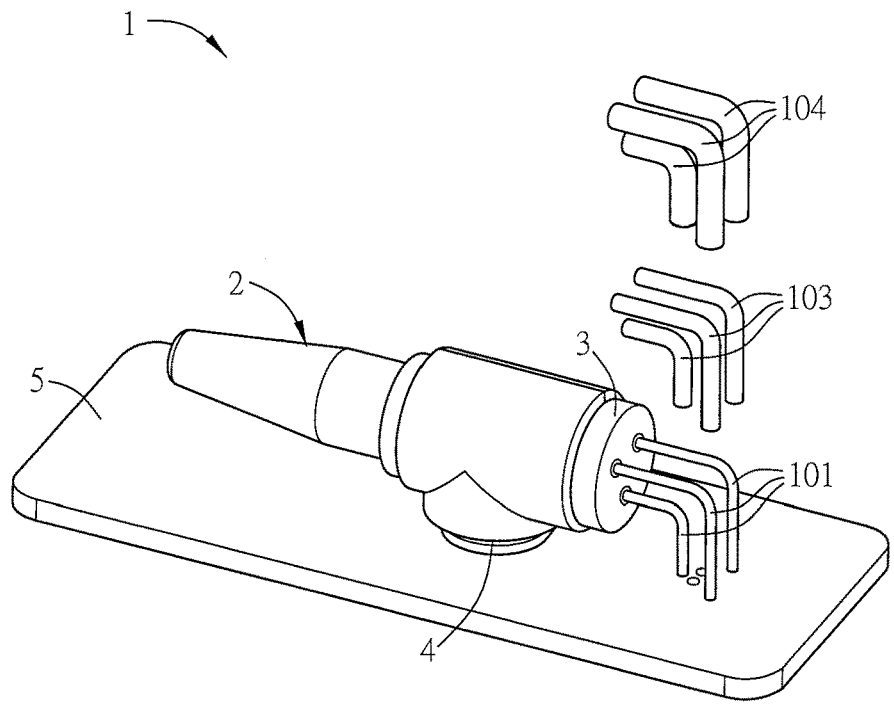
FIG. 1 is a schematic diagram of the assembly of a pin-covering apparatus of the first embodiment of the invention.
Figure 2:
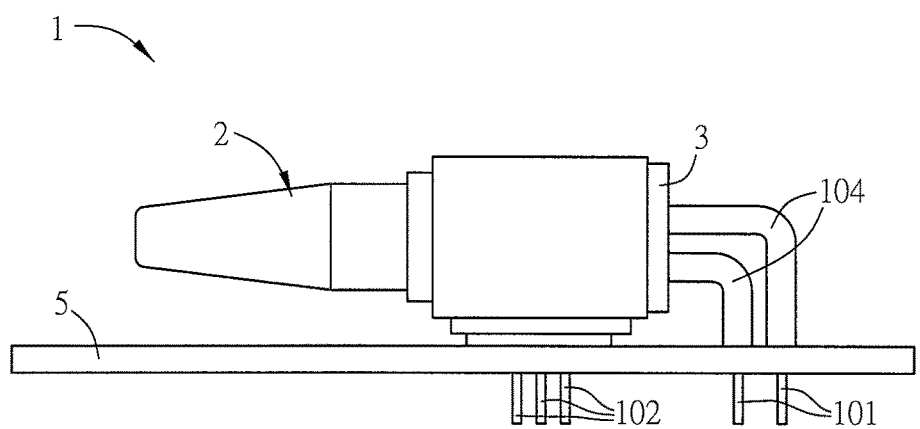
FIG. 2 is a schematic side view of the pin-covering apparatus of the first embodiment of the invention.

Please refer to FIGS. 1 and 2. FIG. 1 is a schematic diagram of the assembly of a pin-covering apparatus 1 of the first embodiment of the invention, and FIG. 2 is a schematic side view of the pin-covering apparatus 1 of the first embodiment of the invention. The pin-covering apparatus 1 is applied to a plurality of pins 101 of an emitting end 3 of a bi-directional optical module 2. Another end of the bi-directional optical module 2 perpendicular to the emitting end 3 is a receiving end 4 having a plurality of pins 102. The pin-covering apparatus 1 includes a plurality of mediums 103 and a plurality of metal sleeves 104. The mediums 103 respectively cover the pins 101. The metal sleeves 104 cover the mediums 103 by taking the pins 101 as centers, respectively. The metal sleeves 104 are disposed at the emitting end 3 of the bi-directional optical module 2.

In this embodiment, the pins 101 disposed on the emitting end 3 have the same impedance calculation as the coaxial cable. The diameter of each of the pins 101 is denoted by d, the diameter of each of the metal sleeves 104 is denoted by D, and the dielectric constant of the medium 103 is denoted by Er. Then, the coaxial impedance thereof Zo can be calculated according to the following equation, and other embodiments also apply thereto.

$$Z_0 = 138 * LOG(D/d)/Er^{0.5}$$

Figure 3:
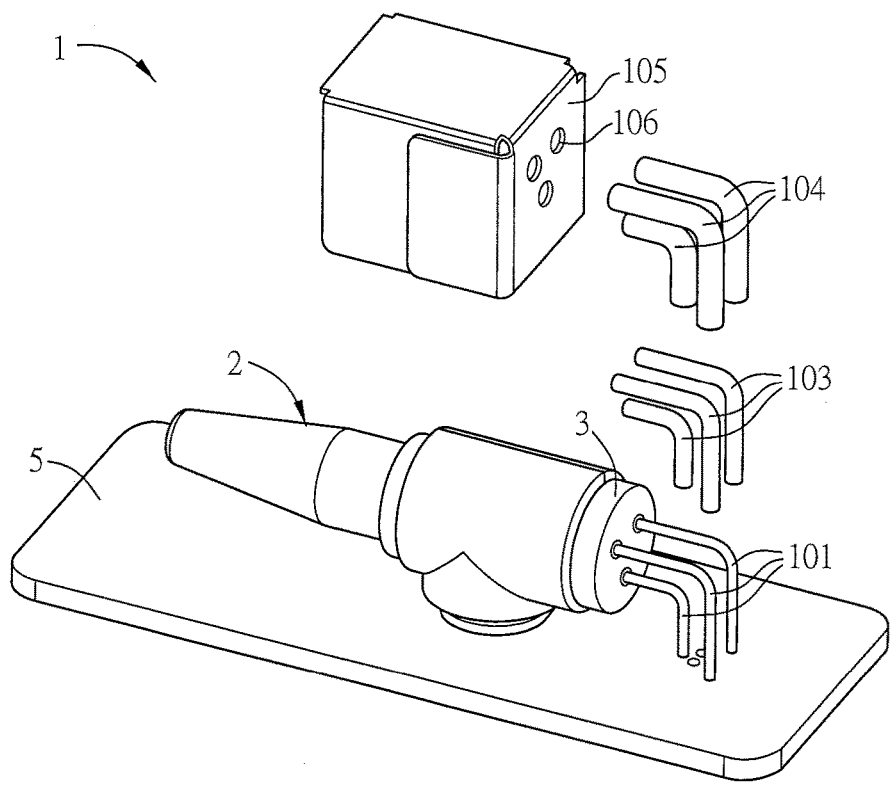
FIG. 3 is a schematic diagram of the assembly of the pin-covering apparatus of the second embodiment of the invention.

Please refer to FIG. 3, which is a schematic diagram of the assembly of the pin-covering apparatus 1 of the second embodiment of the invention. In the second embodiment, the pin-covering apparatus 1 further includes a metal plate 105. The metal sleeves 104 of the pin-covering apparatus 1 are installed to the metal plate 105 first, and then the metal plate 105 with the metal sleeves 104 is installed to the emitting end 3 of the bi-directional optical module 2, The metal plate 105 has a plurality of holes 106. The number and the diameter of the holes 106 correspond to the number of the pins 101 and the diameter of the metal sleeves 104 of the bi-directional optical module 2, respectively.

Please refer to FIGS. 1 and 3. The pins 101 and 102 of the bi-directional optical module 2 can be welded to the connection points of the circuit board 5 to achieve the installation and electrical connection between the bi-directional optical module 2 and the circuit board 5. The metal sleeves 104 cover the mediums 103, and the metal sleeves 104 can be bent for about 90 degrees so that the pins 101 can pass through the circuit board 5 which has a plurality of holes and is disposed under and parallel with the bi-directional optical module 2, thereby improving the deficiencies of the conventional art where the pins will be easily bent and thus deformed due to the too thin diameter and the metal material thereof and thus the pins 101 will be positioned incorrectly.

Figure 4:
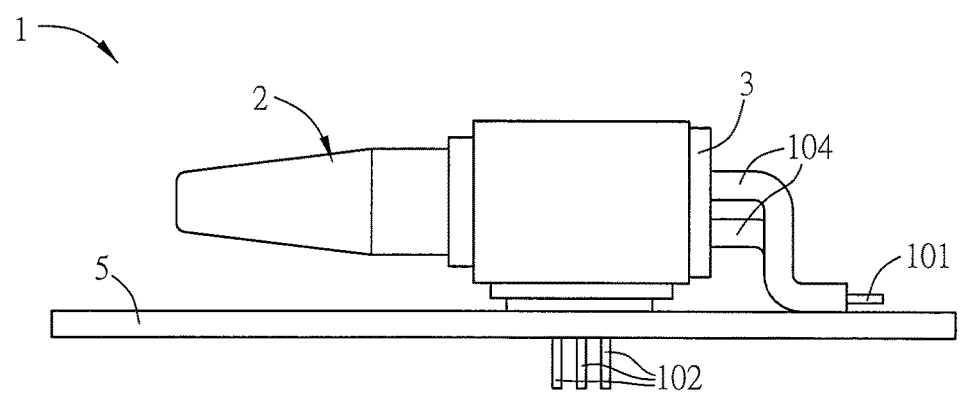
FIG. 4 is a schematic side view of the pin-covering apparatus of the third embodiment of the invention.

Please refer to FIG. 4, which is a schematic side view of the pin-covering apparatus 1 of the third embodiment of the invention. In the third embodiment, the metal sleeves 104 of the pin-covering apparatus 1 are bent for about 90 degrees twice, so that the ends of the metal sleeves 104 farther from the emitting end 3 of the bi-directional optical module 2 are disposed parallel with the circuit board 5 disposed under the bi-directional optical module 2. This embodiment provides a different installation between the emitting end 3 of the bi-directional optical module 2 and the circuit board 5.

A bi-directional optical device disclosed by the above embodiments of the invention includes the bi-directional optical module and the pin-covering apparatus. The bi-directional optical module includes the emitting end including a plurality of pins. The pin-covering apparatus includes a plurality of mediums and a plurality of metal sleeves. The mediums are used to cover the pins. The metal sleeves improve the conventional bi-directional optical module where a plurality of pins will be easily bent and deformed and thus can not be easily positioned. Besides, the concept of coaxial cable is also used to avoid the disturbance from external signals.

In summary, the pin-covering apparatus of this invention surely can achieve the expected purpose of usage so as to eliminate the conventional deficiencies and possess industrial applicability, novelty and non-obviousness.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A pin-covering apparatus applied to a plurality of pins of an emitting end of a bi-directional optical module, comprising:
    a plurality of mediums respectively covering the pins; and
    a plurality of metal sleeves covering the mediums respectively by taking the pins as centers, wherein the metal sleeves are disposed at the emitting end of the bi-directional optical module.

2. The pin-covering apparatus as recited in claim 1, further comprising:
    a metal plate, wherein the metal sleeves are disposed on the metal plate and the metal plate is disposed at the emitting end of the bi-directional optical module.

3. The pin-covering apparatus as recited in claim 2, wherein the metal plate has a plurality of holes, and the number and the diameter of the holes correspond to the number of the pins and the diameter of the metal sleeves, respectively.

4. The pin-covering apparatus as recited in claim 1, wherein the material of the medium is selected from the group of polyethylene or polytetrafluoroethylene.

5. The pin-covering apparatus as recited in claim 1, wherein the metal sleeves are capable of being bent for about 90 degrees so that the pins can pass through a circuit board which has a plurality of holes and is disposed under and parallel with the bi-directional optical module.

6. The pin-covering apparatus as recited in claim 2, wherein the metal sleeves are capable of being bent for about 90 degrees so that the pins can pass through a circuit board which has a plurality of holes and is disposed under and parallel with the bi-directional optical module.

7. A bi-directional optical device, comprising:
a bi-directional optical module including an emitting end including a plurality of pins; and
a pin-covering apparatus used to cover the pins and comprising:
 a plurality of dielectrics respectively covering the pins; and
 a plurality of metal sleeves covering the dielectrics respectively by taking the pins as centers, wherein the metal sleeves are disposed at the emitting end of the bi-directional optical module.

8. The bi-directional optical device as recited in claim 7, wherein the pin-covering apparatus further comprises:
a metal plate, wherein the metal sleeves of the pin-covering apparatus are disposed on the metal plate and the metal plate is disposed at the emitting end of the bi-directional optical module.

9. The bi-directional optical device as recited in claim 8, wherein the metal plate has a plurality of holes, and the number and the diameter of the holes correspond to the number of the pins and the diameter of the metal sleeves, respectively.

10. The bi-directional optical device as recited in claim 7, wherein the materials of the dielectrics are selected from the group of polyethylene or polytetrafluoroethylene.

11. The bi-directional optical device as recited in claim 7, wherein the metal sleeves are capable of being bent for about 90 degrees so that the pins can pass through a circuit board which has a plurality of holes and is disposed under and parallel with the bi-directional optical module.

12. The bi-directional optical device as recited in claim 8, wherein the metal sleeves are capable of being bent for about 90 degrees so that the pins can pass through a circuit board which has a plurality of holes and is disposed under and parallel with the bi-directional optical module.

* * * * *